US009525286B2

(12) United States Patent
Kohler

(10) Patent No.: US 9,525,286 B2
(45) Date of Patent: Dec. 20, 2016

(54) SHUTDOWN SYSTEM AND METHOD FOR PHOTOVOLTAIC SYSTEM

(71) Applicant: TYCO ELECTRONICS CORPORATION, Berwyn, PA (US)

(72) Inventor: Raymond Howard Kohler, Souderton, PA (US)

(73) Assignee: TYCO ELECTRONICS CORPORATION, Berwyn, PA (US)

(*) Notice: Subject to any disclaimer, the term of this patent is extended or adjusted under 35 U.S.C. 154(b) by 423 days.

(21) Appl. No.: 14/135,950

(22) Filed: Dec. 20, 2013

(65) Prior Publication Data

US 2014/0183950 A1 Jul. 3, 2014

(51) Int. Cl.
*H02J 3/00* (2006.01)
*H02J 4/00* (2006.01)
*H01L 31/02* (2006.01)
*H02J 3/38* (2006.01)

(52) U.S. Cl.
CPC .......... *H02J 4/00* (2013.01); *H01L 31/02021* (2013.01); *H02J 3/383* (2013.01); *Y02E 10/50* (2013.01); *Y10T 307/367* (2015.04)

(58) Field of Classification Search
CPC ......... H02J 3/383; H02J 4/00; Y10T 307/336; Y10T 307/406; Y02E 10/50
USPC .................................................. 307/26, 31
See application file for complete search history.

(56) References Cited

U.S. PATENT DOCUMENTS

2012/0140380 A1 6/2012 Lin

FOREIGN PATENT DOCUMENTS

| DE | 10 2010 023549 A1 | 12/2011 |
| DE | 10 2010 054354 A1 | 6/2012 |
| EP | 2 456 035 A1 | 5/2012 |
| WO | 2010/078303 A2 | 7/2010 |
| WO | 2012/166946 A2 | 12/2012 |

OTHER PUBLICATIONS

European Search Report, Mail Date Mar. 27, 2014, EP 14 15 0105, Application No. 14150105.6 1508.

*Primary Examiner* — Carlos Amaya

(57) ABSTRACT

A method and system is provided for achieving power shut down or disconnect at individual solar panel level for a DC solar power system. The system provides fail safe power disconnect for emergencies or electrical system maintenance. A high-frequency current source signal is transmitted over DC power lines to each junction box of a photovoltaic panel array. The high frequency signal is transmitted concurrently with the DC power, and is isolated from an inverter by an inductor. A communications receiver circuit controls the PV panel to short circuit the PV panel output terminals and disconnect the PV panel from the output terminals in response to the high-frequency signal.

14 Claims, 5 Drawing Sheets

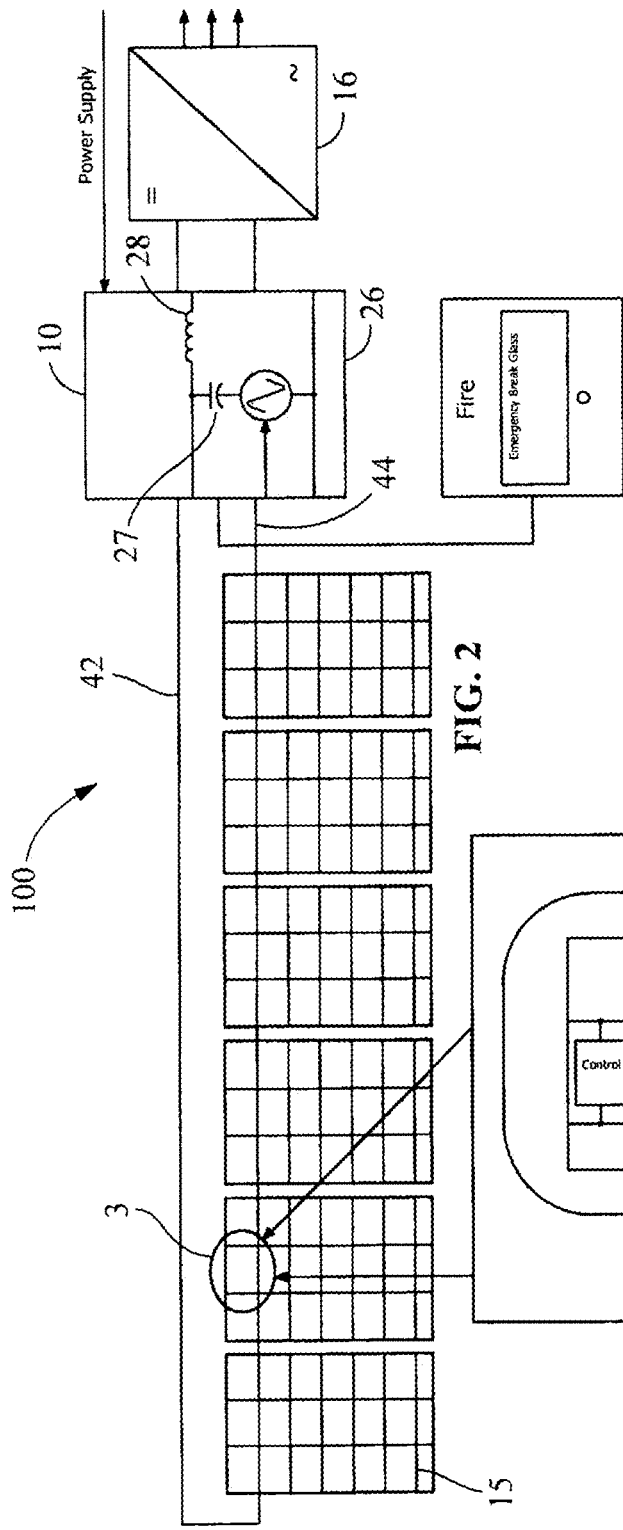

SHUTDOWN SYSTEM AND METHOD FOR PHOTOVOLTAIC SYSTEM

FIELD OF THE INVENTION

The present invention is directed to a safety shutdown system, and more particularly to a system and method for safely powering down a photovoltaic solar panel array.

BACKGROUND OF THE INVENTION

Photovoltaic (PV) arrays, e.g., roof top mounted solar panels, are becoming more widely used as the manufacturing costs are reduced. In a large system a plurality of solar panels are connected in series to increase the power output by the system.

For example, some large PV systems may include 15 to 33 solar panels connected in series. The output voltage associated with an individual PV array may be in the range of 38 to 48 VDC, which results in the operating voltages of 600 to 1500 volts for large PV systems. Such high voltages are output by the PV system when illuminated.

Current systems provide no method of controlling or shutting down the output voltage of a PV system. The inability to controllably power down a PV system presents a problem for emergency personnel when an emergency arises in a building with PV systems providing power in the building. In traditional power systems a main power disconnect may be used to remove power from the building power system, to insure the safety of emergency personnel during their operations in the building. The danger to personnel in an emergency is further increased because the voltage of the large PV system may exceed the line voltage of traditional power systems.

The higher voltage of the PV system is normally distributed over much of the roof area of a building where the solar panels are interconnected. In the event of fire for instance, water may be sprayed on the roof of the building, creating an electrical shock hazard if the panels and wire conductors are exposed to water. To overcome these hazardous situations, many governmental authorities are enacting regulations requiring some means of panel shutdown.

There is a need for providing a means of safely disconnecting power from a PV system to prevent hazardous electrical conditions.

SUMMARY OF THE INVENTION

This disclosure provides a method and system for achieving power shut down or disconnect at the individual solar panel level for all solar panels controlled from a single central or multiple locations. The system is fail-safe and power is disconnected if in the event that the wires burn completely from the solar panels. The disclosed system is simple and inexpensive to implement. Central control of the PV power disconnect system is provided, which enables remote control from a distance, and reliable communications.

The disclosed PV system employs a high frequency, low level signal which enables the control circuit to be implemented with a smaller inductor. A high frequency signal is generated from a current source rather than a voltage. Although not wishing to be bound by any theory, using a current source to generate the signal, as the number of series connected PV panels increases, the voltage developed across the inductor does not change even if the inductance added by the series cable is many times greater than the signal developing inductance. The power level of the received signal remains approximately the same provided the current regulation of the current source is very good. The current signaling may also eliminate errors that may be caused by long runs of series cable resistance when using voltage signaling. Long power cables may be characterized by series inductance that may attenuate the high-frequency signal if voltage signaling is used. Also if the cable routing is uncontrolled large loops may be formed which can further increased cable inductance.

Another advantage is that no additional wires need to be connected to the PV system to implement the shut-down control.

The PV system may be expandable to full duplex.

The PV system may be configured so that the PV system shuts down when the main power is shut off Yet another advantage is that the PV system is not subject to interference such as an RF link.

A further advantage is that the PV system continuously monitors the shut down system for faults and shuts down when a fault is detected.

An embodiment is directed to a method for achieving power shut down or disconnect at the individual photovoltaic panel level for multiple photovoltaic panels. The method includes: generating a low voltage high-frequency current source signal; transmitting the low voltage high-frequency current source signal concurrently with DC power to junction boxes of the multiple photovoltaic panels of a photovoltaic panel array; isolating the low voltage high-frequency current source signal from the DC power; and short circuiting output terminals of respective photovoltaic panels and disconnecting the respective photovoltaic panels from the output terminals in response to the low voltage high-frequency current source signal.

An embodiment is directed to a method for achieving power shut down or disconnect of respective photovoltaic panels of a photovoltaic panel array. The method includes: generating a high-frequency current source signal; transmitting the high-frequency current source signal concurrently with DC power to junction boxes of the respective photovoltaic panels of the photovoltaic panel array; isolating the high-frequency current source signal from the DC power; comparing the value of the amplitude of the high-frequency current source signal to a predetermined threshold value; removing output power from the respective photovoltaic panels associated with a respective junction box if the value of the amplitude of the high-frequency current source signal is less than the threshold value; and short-circuiting output terminals of the respective photovoltaic panels if the value of the amplitude of the high-frequency current source signal is less than the threshold value, thereby providing zero output voltage on the photovoltaic panels.

An embodiment is directed to a system for achieving power shut down or disconnect of respective photovoltaic panels of a photovoltaic panel array. The system includes a control unit which receives input power from a switch. The control unit is provided in electronic communication with respective junction boxes of the respective photovoltaic panels. The switch includes a mains input which receives AC power input from an electrical AC source. An AC to DC converter receives the AC input power from the switch when the switch is actuated. A current source signal generator receives DC power from the converter. The current source signal generator generates a low voltage high-frequency AC signal of a predetermined frequency when the switch is closed.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

FIG. 2 shows a schematic diagram of the exemplary embodiment the PV system of FIG. 1.

FIG. 3 shows an exemplary PV panel junction box.

DETAILED DESCRIPTION OF THE INVENTION

Figure 1:
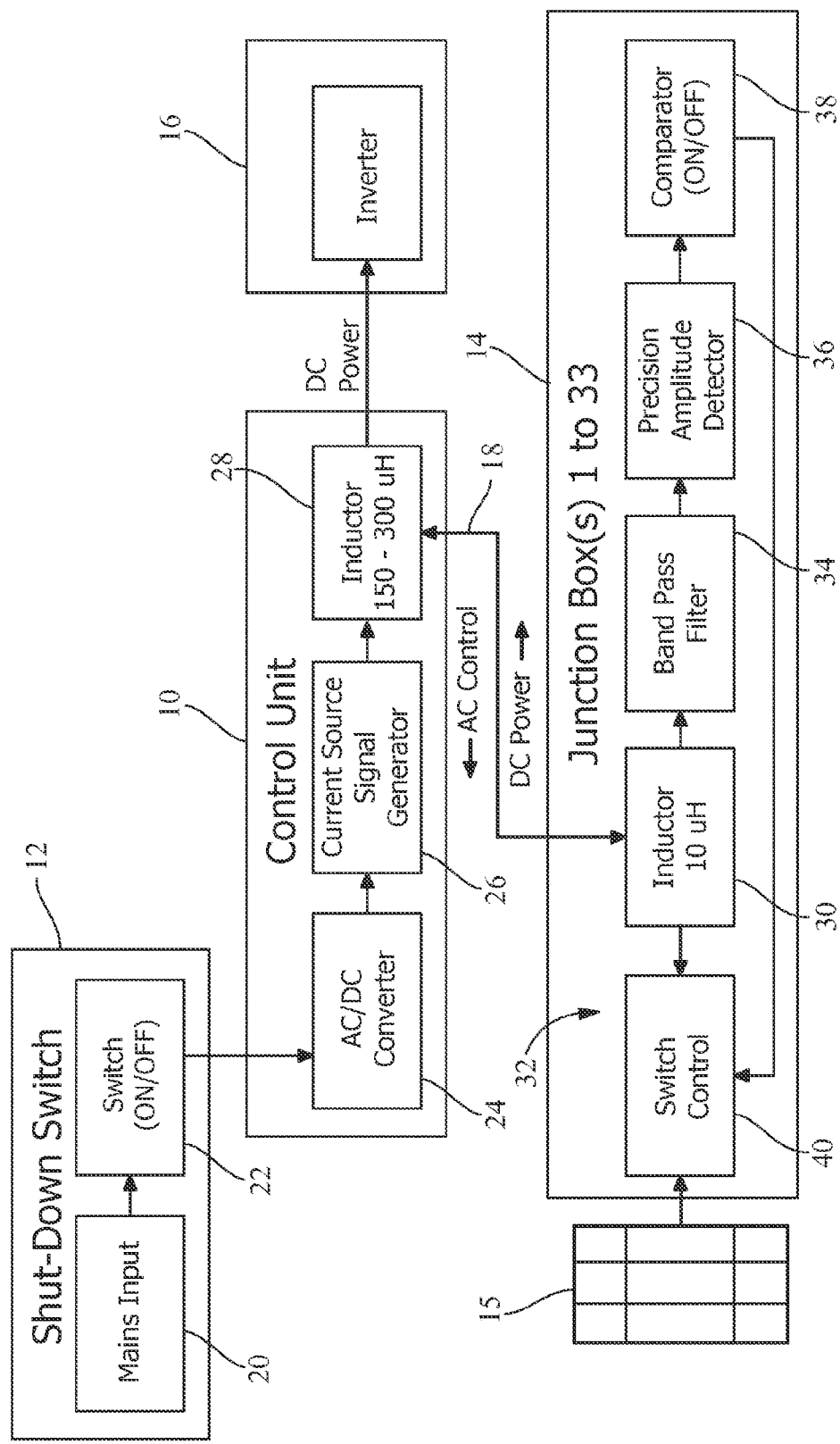
FIG. 1 shows an exemplary block diagram of a PV system shut down control system.

Referring to FIG. 1, a block diagram of the PV system power shut down function is shown. A main control unit 10 receives input power from a shut-down switch 12. Control unit 10 is in electronic communication with each of a plurality of solar or PV panel junction boxes 14. Control unit 10 communicates with PV panel junction boxes 14 over power transmission wires 18 carrying DC input power to an inverter 16 via control unit 10. Shut-down switch 12 includes a mains input 20 sourced, e.g., from the electrical AC main service of a building, a building emergency AC power panel, or other similar AC power source. Mains input 20 is connected to a switch control unit 10 thru a switch 22, e.g., an emergency pushbutton switch, a toggle switch or similar circuit disconnecting device. Control unit 10 includes an AC to DC converter 24 which receives the AC input power from switch 22 when switch 22 is actuated. The output of converter 24 provides DC power to a current source signal generator 26.

When switch 22 is closed, current source generator 26 generates a low voltage high-frequency AC signal of a predetermined frequency, which signal is transmitted to junction boxes 14 through an inductor 28. When switch 22 is open, there is no high-frequency AC signal generated by current source signal generator 26. Each junction box 14 includes an inductor 30 at the input of a PV panel control circuit 32. High-frequency signals, when present, passes through inductor 30 to band pass filter 34. Band pass filter 34 is configured to pass a band of frequencies that includes the predetermined frequency of the high frequency AC signal from inductor 30, and to block frequencies outside of the frequency band of the filter. The output of band pass filter 34 is transmitted to a precision amplitude detector 36. An amplitude detector 36 detects the amplitude of the signal received from band pass filter 34, and a comparator 38 determines if the value of the signal amplitude detected by amplitude detector 36 exceeds a predetermined threshold value. In one embodiment the threshold voltage may be 0.6 volts. In this embodiment if the value of the signal amplitude detected by amplitude detector 36 is less than the 0.6 volt threshold, comparator 38 actuates a switch control 40 to remove output power from a PV panel 15 associated with a respective PV panel junction box 14. Switch control 40 also short-circuits the output terminals of PV panel 15 in response to amplitude detector 36 sensing a low signal level, to ensure zero output voltage on PV panel 15. The presence of the high frequency signal enables PV panel 15 to power up, and the absence of the high frequency signal causes PV panel 15 to shut down.

In an alternate embodiment, if the predetermined threshold value is exceeded, a shut-down signal is transmitted to junction box 14, and comparator 38 actuates a switch control 40 to remove output power from PV panel 15 associated PV panel junction box 14. Switch control 40 also short-circuits the output terminals of PV panel 15 to ensure zero output voltage on PV panel 15.

Referring next to FIG. 2, an exemplary PV system 100 is shown. PV panels 15 are wired in series between a positive DC power line or bus 42 and a negative DC power line or bus 44. The main control unit 10 is connected between PV panels 15 and inverter 16. Shut-down switch 22 may be located remotely or locally relative to main control unit 10. Shut-down switch 22 provides power to AC signal source generator 26. The AC signal output of signal source generator 26 is coupled to positive DC power line 42 via DC capacitor 27 on the line side of inductor 28 relative to inverter 16, which is connected on the load side of inductor 28. In an alternate embodiment, inductor 28 may be connected to PV system 100 via negative DC power line 44 between AC signal source 26 and inverter 16.

PV panels 15 include a junction box 14 (FIG. 3) to connect multiple modules within a PV panel. Modules may be interconnected with diodes to optimize the performance of the system if a PV module is shaded or otherwise fails to produce the rated output power. A shut down circuit 50 may be incorporated in junction box 14.

Figure 4:
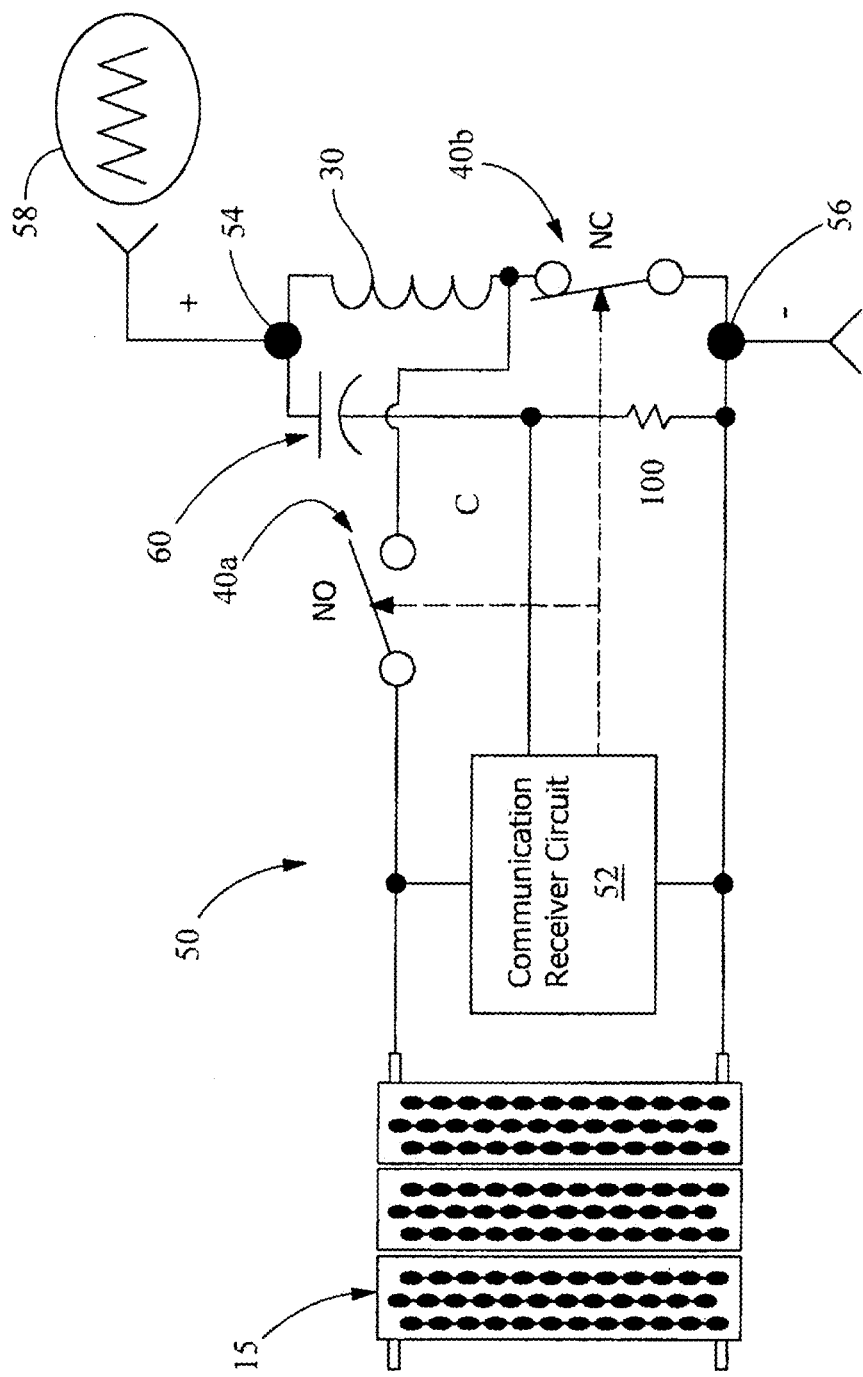
FIG. 4 shows an exemplary PV panel switch control configuration.

Electronic switches, or switch controls 40 are provided in junction box 14. Electronic switches are configured to disconnect the voltage generated by PV panel 15 from the output terminals 54, 56 (FIG. 4). Electronic switches 40 are also configured to short circuit the PV panel output terminals to ensure that no voltage is present on the output terminals. In one embodiment the electronic switches are configured so the default state is "OFF".

A communications signal is transmitted to PV panels 15 on the same cables 44, 42 that carry DC power from PV panels 15. Main control unit 10 transmits a communications signal or high frequency signal from AC signal source 26 to communications receiver circuit 52 in PV panels 15, which switches on PV panels 15, i.e., when the high frequency signal is detected by communications receiver circuit 52, electronic switches 40 route DC power from the internal panel cells of PV panel 15 to the output terminals of PV panel 15. Switch 22 located in an accessible area is wired to main control unit 10. When switch 22 is opened the high frequency signal from control unit 10 is transmitted on power wires 44, 42 to communications receiver circuit 52 for each PV panel 15 is muted. This then shuts down all of the PV panels 15 connected to the PV system 100.

Referring to FIG. 4, an exemplary circuit is shown for implementing shut-down control of a PV panel 15. Output terminals 54, 56 in junction box 14 receive high-frequency AC current source signal 58 from control unit 10. Signal 58 passes through inductor 30 and capacitor 60 connected in series, the inductor 30 and capacitor 60 forming a pass filter. In one embodiment, inductor 30 may have an inductance of approximately 10 micro-Henry. When PV system is in operation signal 58 is present, and communications receiver circuit 52 controls electronic switches 40a and 40b (shown schematically in FIG. 4 as single pole switches for simplicity) in response to the presence of signal 58. Normally open switch 40a is closed when signal 58 is detected by communications receiver circuit 52, and conducts power to output terminals 54, 56 from PV panel 15, while normally closed switch 40b is in an open or non-conducting state, creating an open circuit between inductor 30 and negative output terminal 56. It should be noted that in an alternate embodiment, switch 40 may be connected between the negative output terminal 56 and communications receiver circuit 52 to accomplish the same result.

Once signal 58 is removed as a result of opening switch 22, signal 58 is removed from communications receiver circuit 52, and communications receiver circuit 52 causes electronic switches 40a and 40b to return to their default, or normal, states. Thus switch 40a opens to disconnect PV panel output from inductor 30, and switch 40b closes, resulting in a short circuit between output terminals 54, 56. In one embodiment switching circuits for switches 40a and 40b may include timing elements configured to cause normally closed switch 40b to close before normally open switch 40a opens in response to a shut-down command. In the reverse situation, when applying power again timing elements are configured to cause normally open switch 40a to close before normally closed switch 40b opens.

Figure 5:
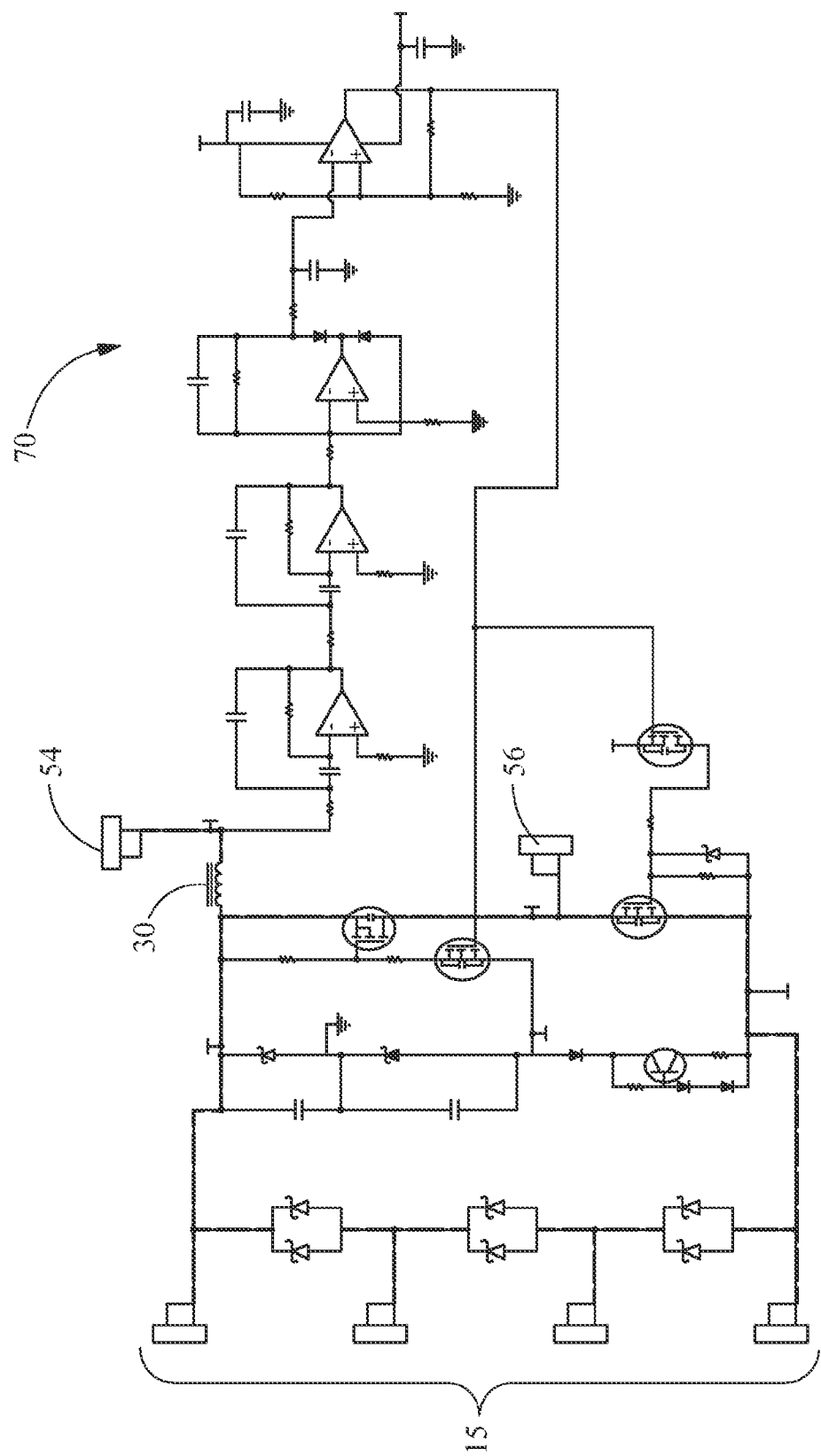
FIG. 5 shows an exemplary communications receiver circuit for a PV panel switch control.

Referring next to FIG. 5, an embodiment of communications receiver circuit 52 is shown. Dashed lines indicate DC power flow from PV panels 15 to output terminals 54, 56. Inductor 30 provides a high impedance to block high-frequency signal 58 from propagating to PV panels 15. Receiver circuits 70 are configured to respond to signal 58 at the predetermined frequency. As discussed above, in an alternate embodiment inductor 30 may be connected in the negative output line rather than in the positive output line, by connecting inductor 30 between receiver circuits 70 and output terminal 56.

Figures 6, 7:
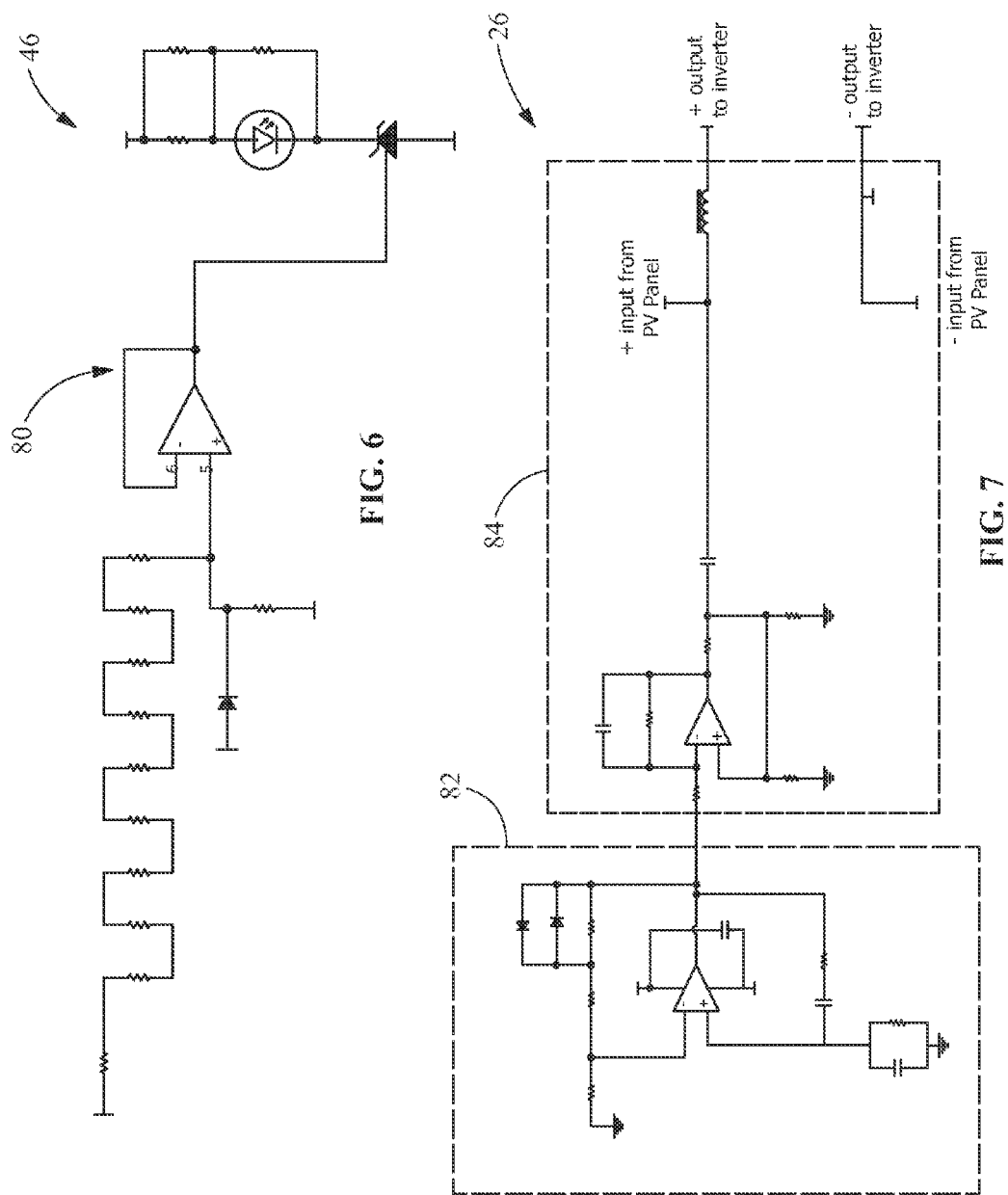
FIG. 6 shows an exemplary a high voltage detection circuit for indication of output voltage level of the PV system.
FIG. 7 shows an exemplary current source signal generator circuit for generating the high-frequency control signal.

Referring to FIG. 6, an exemplary precision amplitude detector 46 comprises a high voltage detection circuit 80 as shown. FIG. 7 shows an exemplary current source signal generator 26. Current source signal generator 26 is implemented via an oscillator circuit 82 driving a current to voltage circuit 84.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for achieving power shut down or disconnect at the individual photovoltaic panel level for multiple photovoltaic panels, the method comprising:
   generating a low voltage high-frequency current source signal;
   transmitting the low voltage high-frequency current source signal concurrently with DC power to junction boxes of the multiple photovoltaic panels of a photovoltaic panel array;
   isolating the low voltage high-frequency current source signal from the DC power;
   short circuiting output terminals of respective photovoltaic panels and disconnecting the respective photovoltaic panels from the output terminals in response to the low voltage high-frequency current source signal;
   a control unit communicating with each junction box over power transmission wires carrying the DC power to an inverter;
   a switch communicating with the control unit, the switch connected to a mains input sourced from an electrical AC source and a circuit disconnecting device; and
   an AC to DC converter of the control unit receiving AC input power from the switch when the switch is actuated, the converter provides DC power to a current source signal generator when the AC input power is received.

2. The method of claim 1, further comprising the current source signal generator generating the low voltage high-frequency current source signal of a predetermined frequency when the switch is closed.

3. The method of claim 2, further comprising transmitting the low voltage high-frequency current source signal to each respective junction box through an inductor.

4. The method of claim 3, further comprising passing the low voltage high-frequency current source signal through the inductor of each respective junction box to a band pass filter of each respective junction box which is configured to pass a band of frequencies that includes the predetermined frequency of the low voltage high-frequency current source signal from the inductor and to block frequencies outside of the frequency band of the filter.

5. The method of claim 4, further comprising:
   transmitting output of the band pass filter to a precision amplitude detector which detects the amplitude of the low voltage high-frequency current source signal received from band pass filter,
   comparing the value of the amplitude of the low voltage high-frequency current source signal detected by the amplitude detector to determine if a predetermined threshold value has been exceeded,
   removing output power from a respective photovoltaic panels associated with a respective junction box if the value of the amplitude of the low voltage high-frequency current source signal is less than the threshold value.

6. The method of claim 5, further comprising short-circuiting the output terminals of the photovoltaic panels if the value of the amplitude of the low voltage high-frequency current source signal is less than the threshold value, thereby providing zero output voltage on the photovoltaic panels.

7. A method for achieving power shut down or disconnect of respective photovoltaic panels of a photovoltaic panel array, the method comprising:
   generating a high-frequency current source signal;
   transmitting the high-frequency current source signal concurrently with DC power to junction boxes of the respective photovoltaic panels of the photovoltaic panel array;
   isolating the high-frequency current source signal from the DC power;
   comparing the value of the amplitude of the high-frequency current source signal to a predetermined threshold value;
   removing output power from the respective photovoltaic panels associated with a respective junction box if the value of the amplitude of the high-frequency current source signal is less than the threshold value;

short-circuiting output terminals of the respective photovoltaic panels if the value of the amplitude of the high-frequency current source signal is less than the threshold value, thereby providing zero output voltage on the photovoltaic panels;

a control unit communicating with each junction box over power transmission wires carrying the DC power to respective inverters;

a switch communicating with the control unit, the switch connected to a mains input sourced from an electrical AC source; and an AC to DC converter of the control unit receiving AC input power from the switch when the switch is actuated, the converter provides DC power to a current source signal generator when the AC input power is received.

8. The method of claim 7, further comprising the current source signal generator generating the high-frequency current source signal of a predetermined frequency when the switch is closed.

9. The method of claim 8, further comprising transmitting the high-frequency current source signal to respective junction boxes of the respective photovoltaic panels through inductors.

10. The method of claim 9, further comprising passing the high-frequency current source signal through the inductors to band pass filters which are configured to pass a band of frequencies that includes the predetermined frequency of the high-frequency current source signal from the inductor and to block frequencies outside of the frequency band of the filter.

11. A system for achieving power shut down or disconnect of respective photovoltaic panels of a photovoltaic panel array, the system comprising:

a control unit which receives input power from a switch, the control unit provided in electronic communication with respective junction boxes of the respective photovoltaic panels;

the switch includes a mains input which receives AC power input from an electrical AC source;

an AC to DC converter which receives the AC input power from the switch when the switch is actuated;

a current source signal generator which receives DC power from the converter, the current source signal generator generates a low voltage high-frequency AC signal of a predetermined frequency when the switch is closed.

12. The system as recited in claim 11, wherein each respective junction box includes an inductor which receives the low voltage high-frequency AC signal of a predetermined frequency.

13. The system as recited in claim 12, wherein each respective junction box includes a band pass filter which is configured to pass a band of frequencies that includes the predetermined frequency of the low voltage high-frequency AC signal.

14. The system as recited in claim 13, wherein each respective junction box includes a comparator which compares an amplitude of the low voltage high-frequency AC signal to a predetermined threshold value.

* * * * *